United States Patent
Peng et al.

(10) Patent No.: US 12,324,245 B2
(45) Date of Patent: Jun. 3, 2025

(54) LAYOUT ARCHITECTURE FOR A CELL

(71) Applicant: Taiwan Semiconductor Manufacturing Company, Ltd., Hsinchu (TW)

(72) Inventors: Shi-Wei Peng, Hsinchu (TW); Hui-Zhong Zhuang, Kaohsiung (TW); Jiann-Tyng Tzeng, Hsinchu (TW); Wei-Cheng Lin, Taichung (TW); Guo-Huei Wu, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/731,387

(22) Filed: Dec. 31, 2019

(65) Prior Publication Data
US 2021/0202466 A1 Jul. 1, 2021

(51) Int. Cl.
*H10D 89/10* (2025.01)
*H01L 23/522* (2006.01)
*H01L 23/535* (2006.01)
*H10D 12/01* (2025.01)

(52) U.S. Cl.
CPC ......... *H10D 89/10* (2025.01); *H01L 23/5226* (2013.01)

(58) Field of Classification Search
CPC ...... G06F 30/392; G06F 30/394; G06F 30/39; H01L 2027/11875; H01L 23/5226; H01L 23/5283; H01L 27/0207; H01L 27/11807; H01L 23/535; H10D 89/10
See application file for complete search history.

(56) References Cited

U.S. PATENT DOCUMENTS

| | | | | |
|---|---|---|---|---|
| 9,461,065 B1 * | 10/2016 | Haigh | | H01L 23/5226 |
| 10,354,045 B2 * | 7/2019 | Omara | | H05K 1/115 |
| 10,366,954 B1 * | 7/2019 | Kim | | G06F 30/392 |
| 2014/0210100 A1 * | 7/2014 | Xiao | | H01L 23/481 |
| | | | | 257/774 |
| 2017/0352623 A1 * | 12/2017 | Chang | | H01L 23/5226 |

* cited by examiner

*Primary Examiner* — Antonio B Crite
(74) *Attorney, Agent, or Firm* — Merchant & Gould P.C.

(57) ABSTRACT

A circuit includes a first metal layer having a first first metal layer strip adjacent to a first boundary and a second first metal layer strip adjacent to a second boundary opposite to the first boundary. The first and second first metal layer strips, the first boundary, and the second boundary are parallel to each other. The circuit further includes a second metal layer having a first second metal layer strip and a second second metal layer strip adjacent to the first second metal layer strip. The first second metal layer strip is connected to the first metal layer strip at the first first metal layer strip and the second second metal layer strip is connected to the first metal layer strip at the second first metal layer strip. Each of the first and the second second metal layer strips are parallel to each other.

20 Claims, 10 Drawing Sheets

LAYOUT ARCHITECTURE FOR A CELL

BACKGROUND

In the formation of integrated circuits, standard cells are often used as base elements for building integrated circuits. The standard cells are placed and routed to form functional circuits. In typical layouts of standard cells, power rails are laid out on the boundaries of the cells. When a plurality of standard cells are placed as rows, the power rails of the standard cells in the same row are connected with each other to form a long power rail that may expand through, for example, thousands or more standard cells. To provide power to the standard cells, additional metal features, known as a jog, is formed in the same metal layer as the power rail. The jog has one end connected to the power rail. The jog extends to directly over a source of a transistor, so that a contact plug may be formed to connect the jog to the source of the transistor.

When the standard cells are placed as rows, there are many jogs extending from a power rail to directly over the respective standard cells. In addition, the jogs extending from the power rail may be too close to abut cells together. Existing power routing schemes require significant amounts of routing resource (such as chip area).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
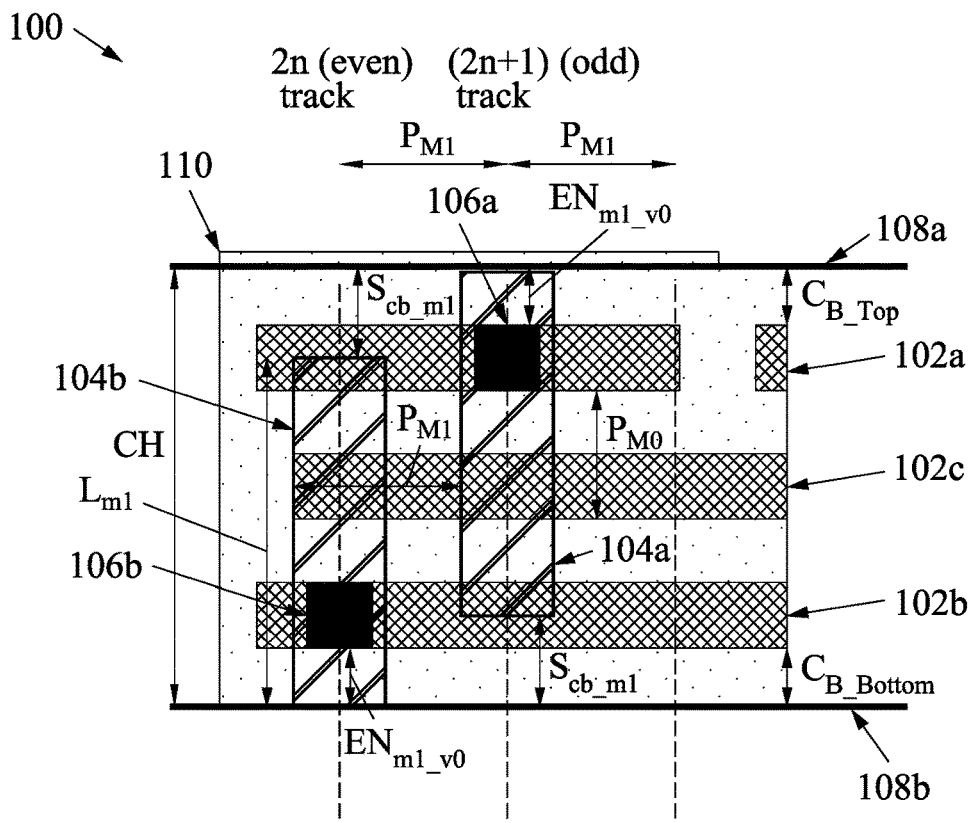
FIG. 1A illustrates a first example placement scenario for a circuit in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The disclosure provides layout guidelines for a circuit with cell abutment without a placement constraint. For example, FIG. 1A illustrates a first example placement scenario 100 for a circuit 110 in accordance with some embodiments. More specifically FIG. 1A illustrates a first example placement 100 of metal layers of circuit 110. Circuit 110 may include a single height cell with a predetermined cell height (designated as CH). In some embodiments, circuit 110 may be a device or a chip containing a plurality of single height cells. As shown in FIG. 1A, circuit 110 includes a plurality of first metal layer strips, that is, a first first metal layer strip 102a, a second first metal layer strip 102b, and a third first metal layer strip 102c. Each of first first metal layer strip 102a, second first metal layer strip 102b, and third first metal layer strip 102c are substantially parallel to one another and extend in a first dimension. First metal layer may be designated as metal layer M0. Although, circuit 110 is shown to include only three first metal strips, a different number of first metal strips are within the scope of the disclosure.

As referred to herein, the first metal layer (also referred to as metal 1 layer or M0) is generally the lowest metal layer in an integrated circuit (IC). That is, M0 is the metal layer closest to a substrate on which the metal layers are formed. A second metal layer (also referred to as metal 2 layer or M1) is the metal layer formed above M0 without any other metal layer between M0 and M1. Likewise, third metal layer (also referred to as metal 3 layer or M2) is the next metal layer formed above M1 without any other metal layer between M1 and M2. The progression of metal layers continues in this fashion until a top metal layer is formed, for example, M7 formed above M6 without any other metal layer between M6 and M7. It is to be understood that the disclosure is not limited to any specific number of metal layers.

Continuing with FIG. 1A, circuit 110 further includes a cell boundary defined by a first boundary 108a (also referred to as a top boundary) and a second boundary 108b (also referred to as a bottom boundary). First boundary 108a is substantially parallel to second boundary 108b. First boundary 108a is spaced from second boundary 108b by a predetermined distance, or the cell height (designated as CH). The cell boundary may further include a third boundary and a fourth boundary (not shown). In example embodiments, first boundary 108a and second boundary 108b may define boundary of the substrate.

The plurality of first metal layer strips are placed substantially parallel to first boundary 108a and second boundary 108b. For example, and as shown in FIG. 1A, first first metal layer strip 102a is placed adjacent to and at a first predetermined distance (designated as $C_{B\_Top}$) from first boundary 108a. First first metal layer strip 102a is substantially parallel to first boundary 108a. Similarly, second first metal layer strip 102b is placed adjacent to and at a second predetermined distance (designated as $C_{B\_Bottom}$) from second boundary 108b. Second first metal layer strip 102b is substantially parallel to second boundary 108b. Third first metal layer strip 102c is placed between first first metal layer strip 102a and second first metal layer strip 102b. Each of the first predetermined distance and the second predetermined distance is in a range of $0.2P_{M0}$ and $0.5P_{M0}$ (that is, $C_{B\_Top}, C_{B\_Bottom} < 0.2P_{M0} - 0.5P_{M0}$), where $P_{M0}$ is a pitch of the first metal layer strips. The pitch of the plurality of first metal layer strips (designated as $P_{M0}$) is determined as a distance between a first long edge of first first metal layer strip 102a and the first long edge of second first metal layer strip 102b. Although only one first metal layer strip (that is, third first metal layer strip 102c) is shown to be placed between first first metal layer strip 102a and second first metal layer strip 102b, it will be apparent to a person with ordinary skill in the art after reading this disclosure that more than one first metal layer strips (for example, a fourth first metal layer strip 102d, etc.) may be placed between first first metal layer strip 102a and second first metal layer strip 102b.

Circuit 110 further includes a plurality of second metal layer strips, that is, a first second metal layer strip 104a and a second second metal layer strip 104b. Each of the plurality of second metal layer strips extend in a second dimension which is different from the first dimension of the plurality of first metal layer strips. For example, the plurality of second metal layer strips are placed perpendicular to the plurality of first metal layer strips. First second metal layer strip 104a of the plurality of second metal layer strips is placed substantially parallel to second second metal layer strip 104b. Second metal layer may be designate as a metal layer M1. A length of each of first second metal layer strip 104a and second second metal layer strip 104b may be approximately equal to or greater than 0.5CH. A pitch of the plurality of second metal layer strips (designated as $P_{M1}$) is determined as a distance between a first long edge of first second metal layer strip 104a and the first long edge of second second metal layer strip 104b. Although, circuit 110 is shown to include only two second metal layer strips, a different number of second metal layer strips are within the scope of the disclosure.

In example embodiments, the plurality of second metal layer strips may be classified as an odd and even tracks in alternate. For example, first second metal layer strip 104a of the plurality of second metal layer strips may be classified as an odd track (that, is 2n+1) of device 100. In addition, second second metal layer strip 104b may represent an even track (that, is 2n) of device 100. Similarly, a third second metal layer strip (not shown) may classified as an odd track (that, is 2n+1) and a fourth second metal layer strip (not shown) may be classified as an even track (that, is 2n), and so on.

Each of the plurality of second metal layer strips are connected to at least one of the plurality of first metal layer strips through one or more vias. Via or alternative connection structures, may be used to connect the appropriate vertical and horizontal conductive traces, such as, at an intersection of a horizontal conductive and a vertical conductive trace. The term via as used herein, is intended to refer broadly to a conductive structure providing electrical connection between different metal layers in an IC.

In example first placement scenario 100, even track second metal layer strips are connected to a first metal layer strip which is adjacent to the bottom boundary and the odd track second metal layer strips are connected to a first metal layer strip which is adjacent to the top boundary. That is, the plurality of second metal layer strips are connected to first metal layer strips adjacent to opposite cell boundaries in alternate. For example, and as illustrated in FIG. 1A, first second metal layer strip 104a is connected to first first metal layer strip 102a which is adjacent to first boundary 108a through a first via 106a. Moreover, and as shown in FIG. 1A, second second metal layer strip 104b is connected to second first metal layer strip 102b which is adjacent to second boundary 108b through a second via 106b. First via 106a may be placed at a predetermined distance (designated as $EN_{m1\_v0}$) from a first end of first second metal strip 104a. Similarly, second via 106b may also be placed at the predetermined distance (designated as $EN_{m1\_v0}$) from a second end of second second metal strip 104b.

In example embodiments, in first placement scenario 100, the even track second metal layer strips extend from the bottom boundary towards the top boundary, falling short of the top boundary by a first predetermined distance (designated as $S_{cb\_m1}$). For example, and as shown in FIG. 1A, second second metal layer strip 104b extends from second boundary 108b towards first boundary 108a and falls short of first boundary 108a by the distance $S_{cb\_m1}$. That is, a first end of second second metal layer strip 104b is located at second boundary 108b and a second end of second second metal layer strip 104b is located is at the distance $S_{cb\_m1}$ sort of first boundary 108a.

In addition, in the example first placement scenario, the odd track second metal layer strips extend from the top boundary and extend towards the bottom boundary, falling short of the bottom boundary by the first predetermined distance (designated as $S_{cb\_m1}$). For example, and as shown in FIG. 1A, first second metal layer strip 104a extends from first boundary 108a towards second boundary 108b and falls short of second boundary 108b by the distance $S_{cb\_m1}$. That is, a second end of first second metal layer strip 104a is located at first boundary 108a and a first end of first second metal layer strip 104a is located at the distance $S_{cb\_m1}$ sort of second boundary 108b. The distance $S_{cb\_m1}$ is approximately equal to or greater than one half of $P_{M0}$ (that is $S_{cb\_m1} > 0.5P_{M0}$).

Figure 1B:
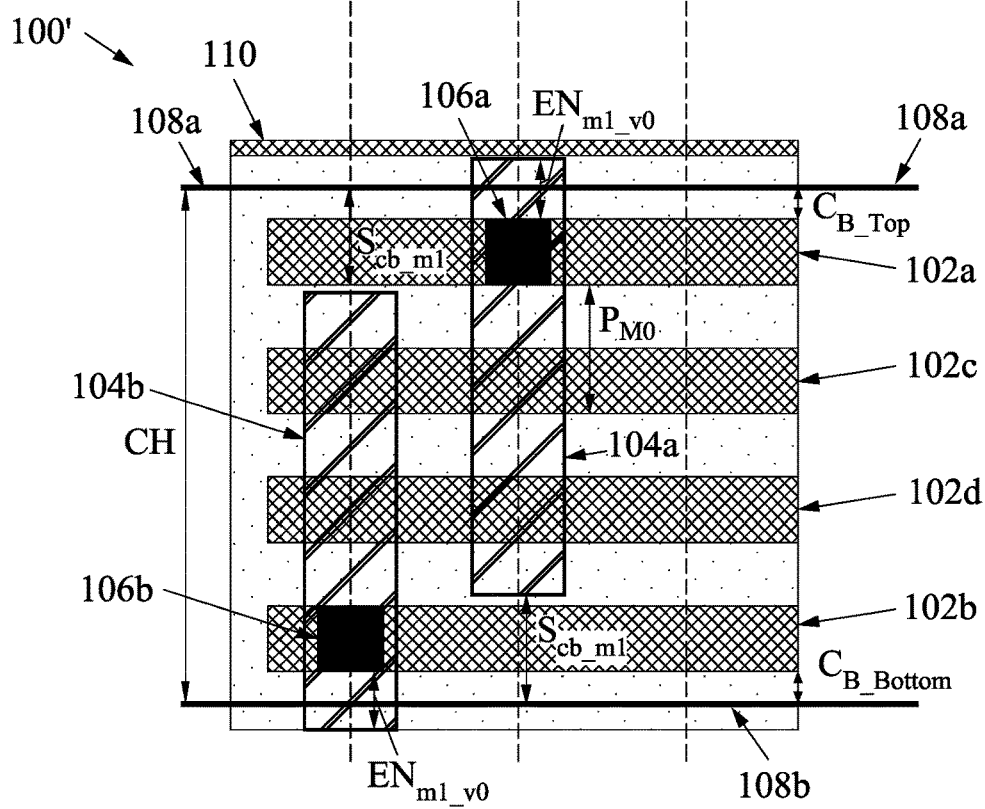
FIG. 1B illustrates an alternate first example placement scenario for a circuit in accordance with some embodiments.

In an example alternate embodiment, of first placement scenario 100, second metal layer strips may extend beyond the cell boundary. For example, even track second metal layer strips may extend beyond the bottom boundary and odd track second metal layer strips may extend beyond the top boundary. That is, alternate second metal layer strips may extend opposite cell boundaries in the alternate. FIG. 1B illustrates an alternate first placement scenario 100' in which second metal layer strips of circuit 110 extend beyond cell boundary. For example, and as illustrated in FIG. 1B, second second metal layer strip 104b may extend beyond second boundary 108b (that is, beyond the bottom boundary) and first second metal layer strip 104a may extend beyond first boundary 108a (that is, beyond the top boundary). However, for second second metal layer strip 104b to cross second boundary 108b, a distance of second via 106b, which connects second second metal layer strip 104b and second first metal layer strip 102b, from a first end of second second metal layer strip 104b (designated as $EN_{m1\_v0}$) is greater than $0.3P_{M0}$ (that is, $EN_{m1\_v0} > 0.3P_{M0}$). Similarly, for first second metal layer strip 104a to cross first boundary 108a, a distance of first via 106a, which connects first second metal layer strip 104a and first first metal layer strip 102a, from a second end of first second metal layer strip 104a (designated as $EN_{m1\_v0}$) is greater than $0.3P_{M0}$ (that is, $EN_{m1\_v0} > 0.3P_{M0}$). Circuit 110 of FIG. 1B also includes a third first metal layer strip 102c and a fourth first metal layer strip 102d.

Figure 2A:
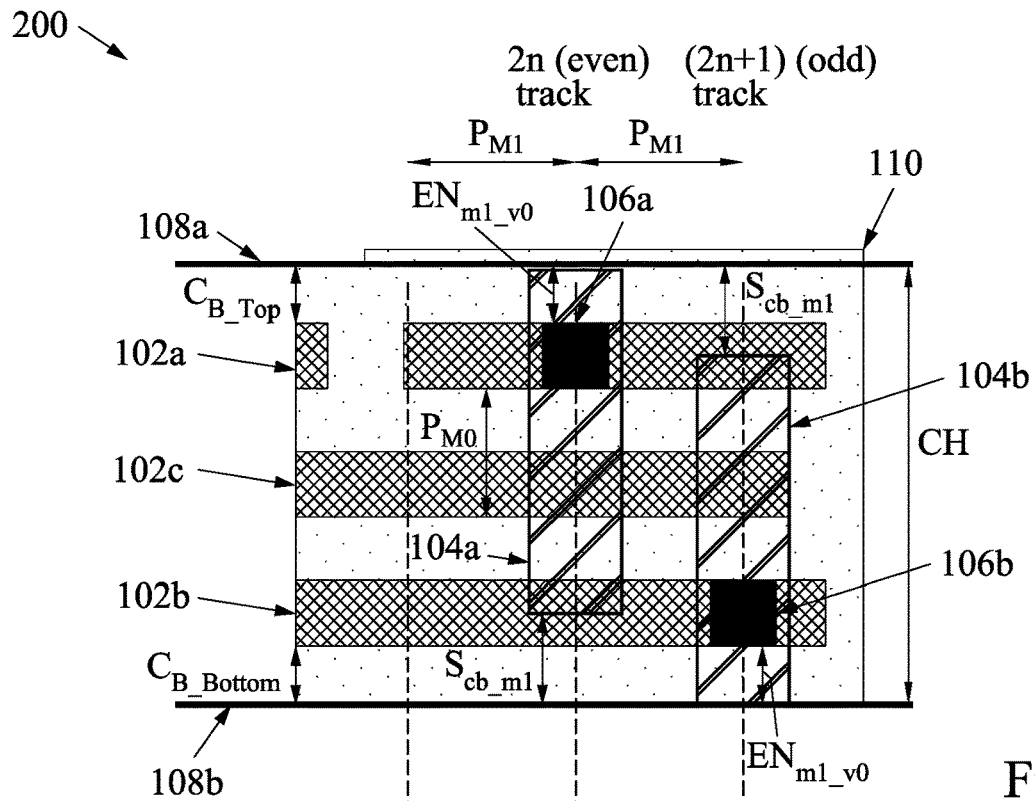
FIG. 2A illustrates a second example placement scenario for a circuit in accordance with some embodiments.

In an example second placement scenario 200, even track second metal layer strips are connected to a first metal layer strip which is adjacent to the top boundary and the odd track second metal layer strips are connected to a first metal layer strip which is adjacent to the bottom boundary. That is, the alternate second metal layer strips are connected to first metal layer strips adjacent to opposite cell boundaries in the alternate. FIG. 2A illustrates an example second placement scenario 200 of circuit 110. For example, and as illustrated in FIG. 2A, first second metal layer strip 104a is connected to first first metal layer strip 102a which is adjacent to first boundary 108a through a first via 106a. Similarly, second second metal layer strip 104b is connected to second first metal layer strip 102b which is adjacent to second boundary 108b through second via 106b.

Figure 2B:
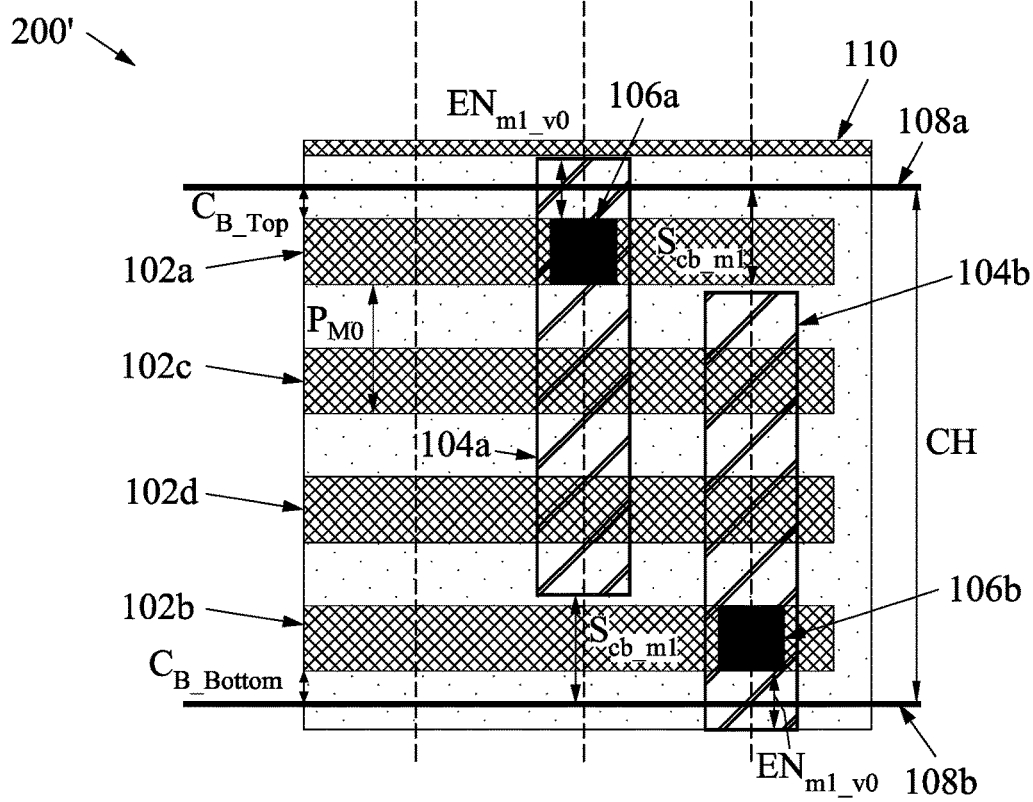
FIG. 2B illustrates an alternate second example placement scenario of a circuit in accordance with some embodiments.

In an example alternate embodiment of second placement scenario 200, second metal layer strips may extend beyond the cell boundary. For example, even track second metal layer strips may extend beyond the top boundary and odd track second metal layer strips may extend beyond the bottom boundary. That is, the alternate second metal layer strips may extend opposite cell boundaries in the alternate. FIG. 2B illustrates an alternate second example placement scenario 200' of metal layers in circuit 110 in which second metal layer strips extend beyond cell boundaries. For example, and as illustrated in FIG. 2B, first second metal layer strip 104a may extend beyond first boundary 108a (that is, beyond the top boundary) and second second metal layer strip 104b may extend beyond second boundary 108b (that is, beyond the bottom boundary). However, for first second metal layer strip 104a to cross first boundary 108a, a distance of first via 106a, which connects first second metal layer strip 104a and first first metal layer strip 102a, from a first end of first second metal layer strip 104a (designated as $EN_{m1\_v0}$) is greater than $0.3P_{M0}$ (that is, $EN_{m1\_v0} > 0.3PM_0$). Similarly, for second second metal layer strip 104b to cross second boundary 108b, a distance of second via 106b, which connects second second metal layer strip 104b and second first metal layer strip 102b, from a second end of second second metal layer strip 104b (designated as $EN_{m1\_v0}$) is greater than $0.3P_{M0}$ (that is, $EN_{m1\_v0} > 0.3P_{M0}$). Circuit 110 of FIG. 2B also includes third first metal layer strip 102c and fourth first metal layer strip 102d.

Figure 3A:
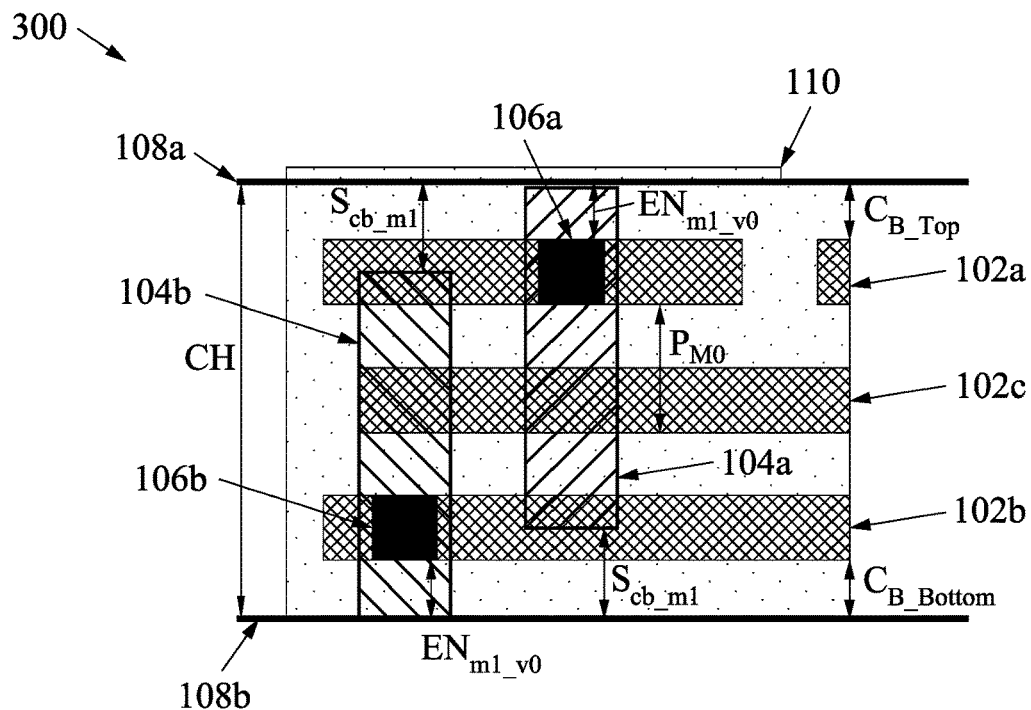
FIG. 3A illustrates a third example placement scenario for a circuit in accordance with some embodiments.

In an example third placement scenario, first color second metal layer strips are connected to a first metal layer strip which is adjacent to the bottom boundary and second color second metal layer strips are connected to a first metal layer strip which is adjacent to the top boundary. FIG. 3A illustrates an example third placement scenario 300 for circuit 110 of such configuration. As shown in FIG. 3A, first second metal layer strip 104a is of first color (that is, color A) and second second metal layer strip 104B is of second color (that is, color B). In example embodiments, the first color represents a first pattern of second metal layer strips and the second color represents a second pattern of second metal layer strips, the second pattern being different from the first pattern.

In example embodiments, multiple patterning (or multi-patterning) processes encompass a group of techniques and methods that have been developed to allow for the imaging of ever smaller metal patterns used for increasing feature density in a layout beyond what is achievable during the manufacture of integrated circuits using a single mask. Double patterning is a technology developed for lithography to enhance feature density in integrated circuits, but each additional mask utilized in the production of an IC device increases the cost of manufacturing, reduces the production capacity of the fab, and/or increases the likelihood of introducing one or more defects.

Various techniques have been created to implement double or multiple patterning. One technique is a pattern-etch-pattern-etch (2P2E) technique. In a 2P2E technique, a pattern is divided into two parts (Color A and Color B) that are implemented sequentially during the IC device manufacturing process using two patterning steps with each patterning step followed by a corresponding etch (removal) process.

Continuing with FIG. 3A, in example third placement scenario 300, first second metal layer strip 104a, which is of the first color, is connected to first first metal layer strip 102a which is adjacent to first boundary 108a through a first via 106a. Similarly, second second metal layer strip 104b, which is of the second color is connected to second first metal layer strip 102b which is adjacent to second boundary 108b through second via 106b.

Figure 3B:
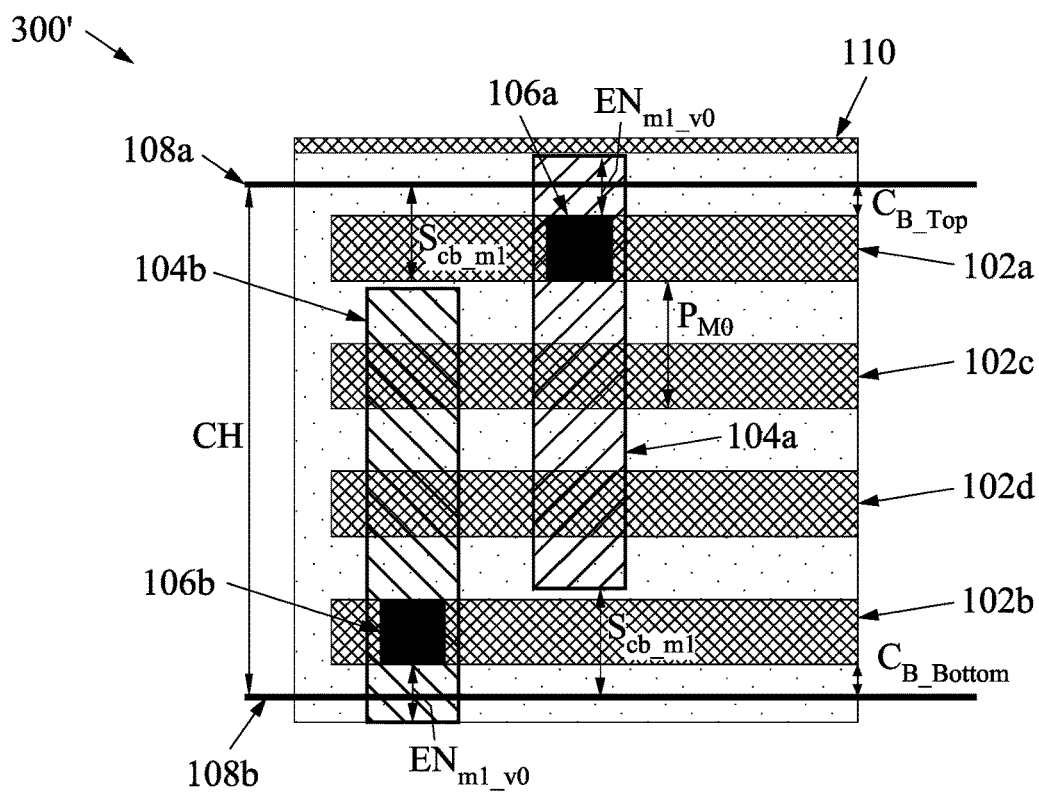
FIG. 3B illustrates an alternate third example placement scenario of a circuit in accordance with some embodiments.

In an example alternate embodiment of third placement scenario 300, second metal layer strips may extend beyond the cell boundaries. For example, first color second metal layer strips may extend beyond the top boundary and second color second metal layer strips may extend beyond the bottom boundary. FIG. 3B illustrates an alternate third placement scenario 300' of circuit 110 in which second metal layer strips extend beyond cell boundary. For example, and as illustrated in FIG. 3B, first second metal layer strip 104a extend beyond first boundary 108a (that is, beyond the top boundary) and second second metal layer strip 104b may extend beyond second boundary 108b (that is, beyond the bottom boundary). However, for first second metal layer strip 104a to cross first boundary 108a, a distance of first via 106a, which connects first second metal layer strip 104a and first first metal layer strip 102a, from a first end of first second metal layer strip 104a (designated as $EN_{m1\_v0}$) is greater than $0.3P_{M0}$ (that is, $EN_{m1\_v0} > 0.3P_{M0}$). Similarly, for second second metal layer strip 104b to cross second boundary 108b, a distance of a third via 106a, which connects second second metal layer strip 104b and second first metal layer strip 102b, from a second end of second second metal layer strip 104b (designated as $EN_{m1\_v0}$) is greater than $0.3P_{M0}$ (that is, $EN_{m1\_v0} > 0.3P_{M0}$). Circuit 110 of FIG. 3B also includes third first metal layer strip 102c and fourth first metal layer strip 102d. Although third example placement scenarios 300 and 300' are shown to include only two colors second metal layer strips (that is, color A and color B), it will be apparent to a person with ordinary skill in the art after reading this disclosure that the second metal layer strips may include more than two colors.

Figure 4A:
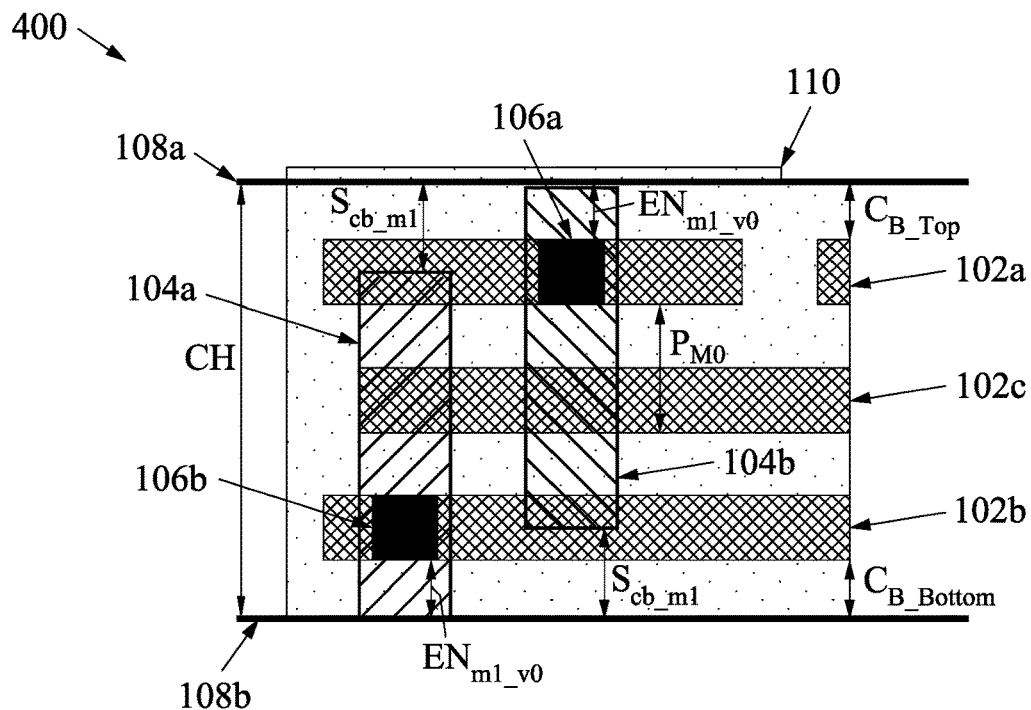
FIG. 4A illustrates a fourth example placement scenario for a circuit in accordance with some embodiments.

In an example fourth placement scenario 400, first color second metal layer strips are connected to a first metal layer strip which is adjacent to the top boundary and second color second metal layer strips are connected to a first metal strip which is adjacent to the bottom boundary. FIG. 4A illustrates an example fourth placement scenario 400 for circuit 110 for such configuration. As shown in FIG. 4A, first second metal layer strip 104a is of the second color (that is, color B) and second second metal layer strip 104B is of the first color (that is, color A). In example fourth placement scenario 400, first second metal layer strip 104a, which is of the second color, is connected to first first metal layer strip 102a which is adjacent to first boundary 108a through a first via 106a. Similarly, second second metal layer strip 104b, which is of the first color is connected to second first metal layer strip 102b which is adjacent to second boundary 108b through second via 106b.

Figure 4B:
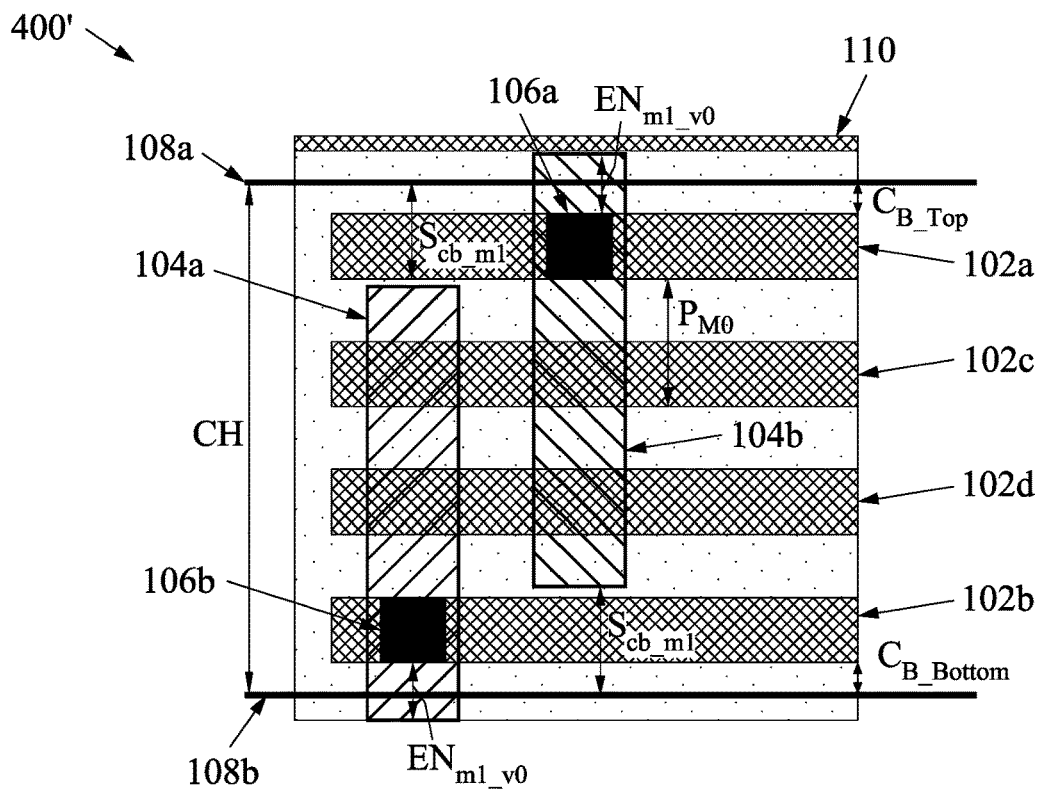
FIG. 4B illustrates an alternate fourth example placement scenario of a circuit in accordance with some embodiments.

In example alternate embodiment of fourth placement scenario 400, second metal layer strips may extend beyond the cell boundaries. For example, second color second metal layer strips may extend beyond the top boundary and first color second metal layer strips may extend beyond the bottom boundary. FIG. 4B illustrates an example alternate fourth placement 400 of circuit 110 in which second metal layer strips extend beyond the cell boundaries. For example, and as illustrated in FIG. 4B, first second metal layer strip 104a extends beyond first boundary 108a (that is, beyond the top boundary) and second second metal layer strip 104b extends beyond second boundary 108b (that is, beyond the bottom boundary). However, for first second metal layer strip 104a to extend beyond (that is, to cross) first boundary 108a, a distance of first via 106a, which connects first second metal layer strip 104a and first first metal layer strip 102a, from a first end of first second metal layer strip 104a (designated as $EN_{m1\_v0}$) is greater than $0.3P_{M0}$ (that is, $EN_{m1\_v0} > 0.3P_{M0}$). Similarly, for second second metal layer strip 104b to cross second boundary 108b, a distance of a third via 106a, which connects second second metal layer strip 104b and second first metal layer strip 102b, from a second end of second second metal layer strip 104b (designated as $EN_{m1\_v0}$) is greater than $0.3P_{M0}$ (that is, $EN_{m1\_v0} > 0.3P_{M0}$). Circuit 110 of FIG. 4B also includes third first metal layer strip 102c and fourth first metal layer strip 102d. Although fourth example placement scenarios 400 and 400' are shown to include only two colors second metal layer strips (that is, color A and color B), it will be apparent to a person with ordinary skill in the art after reading this disclosure that the second metal layer strips may include more than two colors.

Figure 5:
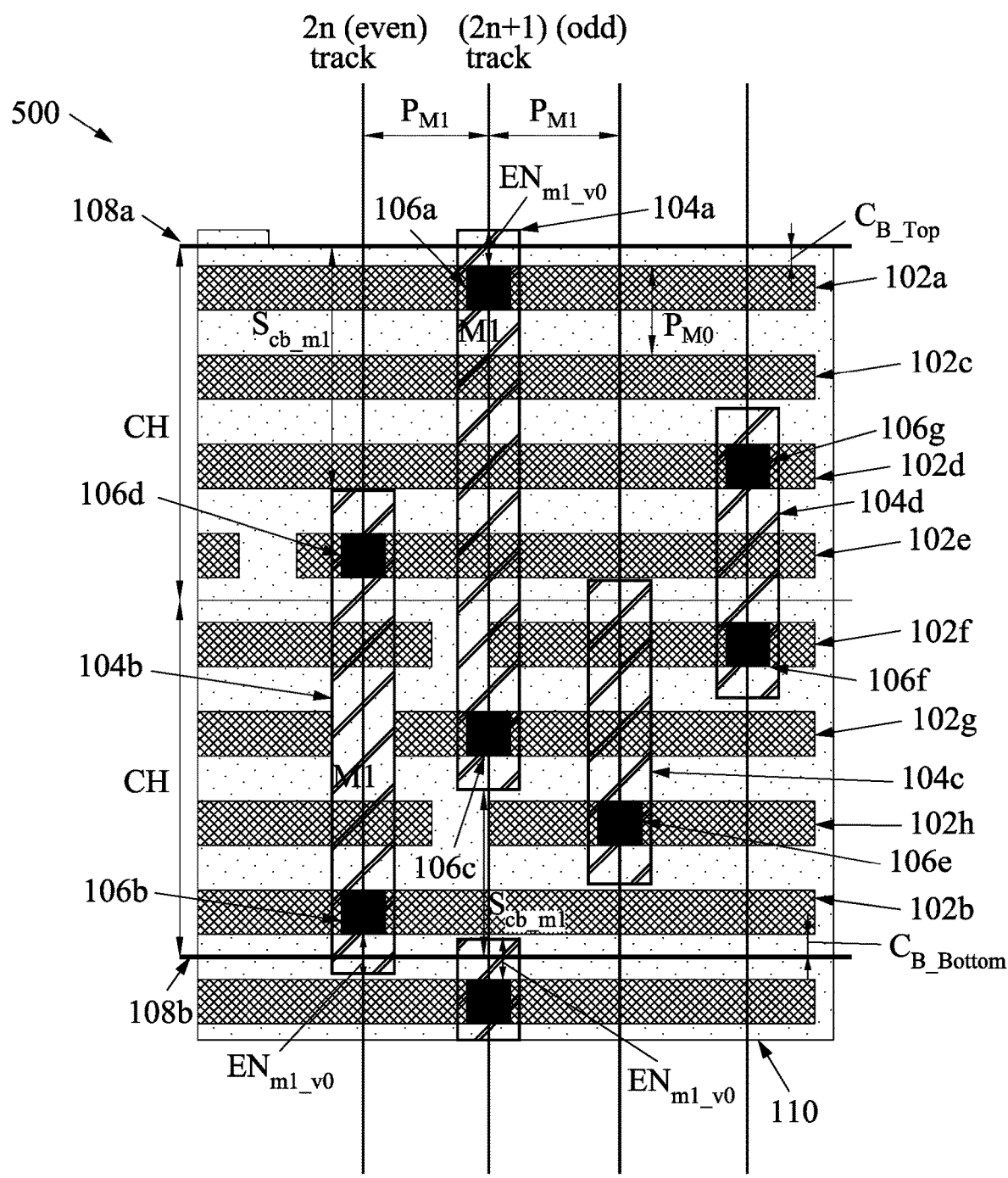
FIG. 5 illustrates a fifth example placement scenario for a circuit in accordance with some embodiments.

FIG. 5 illustrates an example fifth placement scenario 500 of circuit 110 in accordance with some embodiments. In example fifth placement scenario 500, circuit 110 includes a double height cell which includes a plurality of first metal layer strips, for example, a first first metal layer strip 102a, a second first metal layer strip 102b, a third first metal layer strip 102c, a fourth first metal layer strip 102d, a fifth first metal layer strip 102e, a sixth first metal layer strip 102f, a seventh first metal layer strip 102g, and an eighth first metal layer strip 102h. Each cell of the double height cell includes four first metal strips (also referred to as $4M_0$ configuration). In addition, circuit 110 includes a plurality of second metal layer strips, for example, a first second metal layer strip 104a, a second second metal layer strip 104b, a third second metal layer strip 104c, and a fourth second metal layer strip 104d. First first metal layer strip 102a is adjacent to first boundary 108a and second first metal layer strip 102b is adjacent to second boundary 108b.

In example fifth placement scenario 500, the even track second metal layer strips are connected to a first metal layer strip which is adjacent to the bottom boundary and the odd track second metal layer strips are connected to a first metal layer strip which is adjacent to the top boundary. For example, and as illustrated in FIG. 5, first second metal layer strip 104a is connected to first first metal layer strip 102a which is adjacent to first boundary 108a through a first via 106a. Moreover, and as shown in FIG. 5, second second metal layer strip 104b is connected to second first metal layer strip 102b which is adjacent to second boundary 108b through a second via 106b. First via 106a may be placed at a predetermined distance (designated as $EN_{m1\_v0}$) from a first end of first second metal layer strip 104a. Similarly, second via 106b may also be placed at the predetermined distance (designated as $EN_{m1\_v0}$) from a second end of second second metal layer strip 104b.

In addition, first second metal layer strip 104a is also connected to seventh first metal layer strip 102g through a third via 106c. Moreover, second second metal layer strip 104b is connected to fifth first metal layer strip 102e through a fourth via 106d. In addition, third second metal layer strip 104c is connected to eighth first metal layer strip 102h through a fifth via 106e. Furthermore, fourth second metal layer strip 104d is connected to sixth first metal layer strip 102f through a sixth via 106f and to fourth first metal layer strip 102d through a seventh via 106g.

In example embodiments, in example fifth placement scenario 500, the even track second metal layer strips can extend beyond the bottom boundary. For example, and as shown in FIG. 5, second second metal layer strip 104b extends beyond second boundary 108b. In addition, in the example fifth placement scenario, the odd track second metal layer strips can extend beyond the top boundary. For example, and as shown in FIG. 5, first second metal layer strip 104a extends beyond first boundary 108a.

Figure 6:
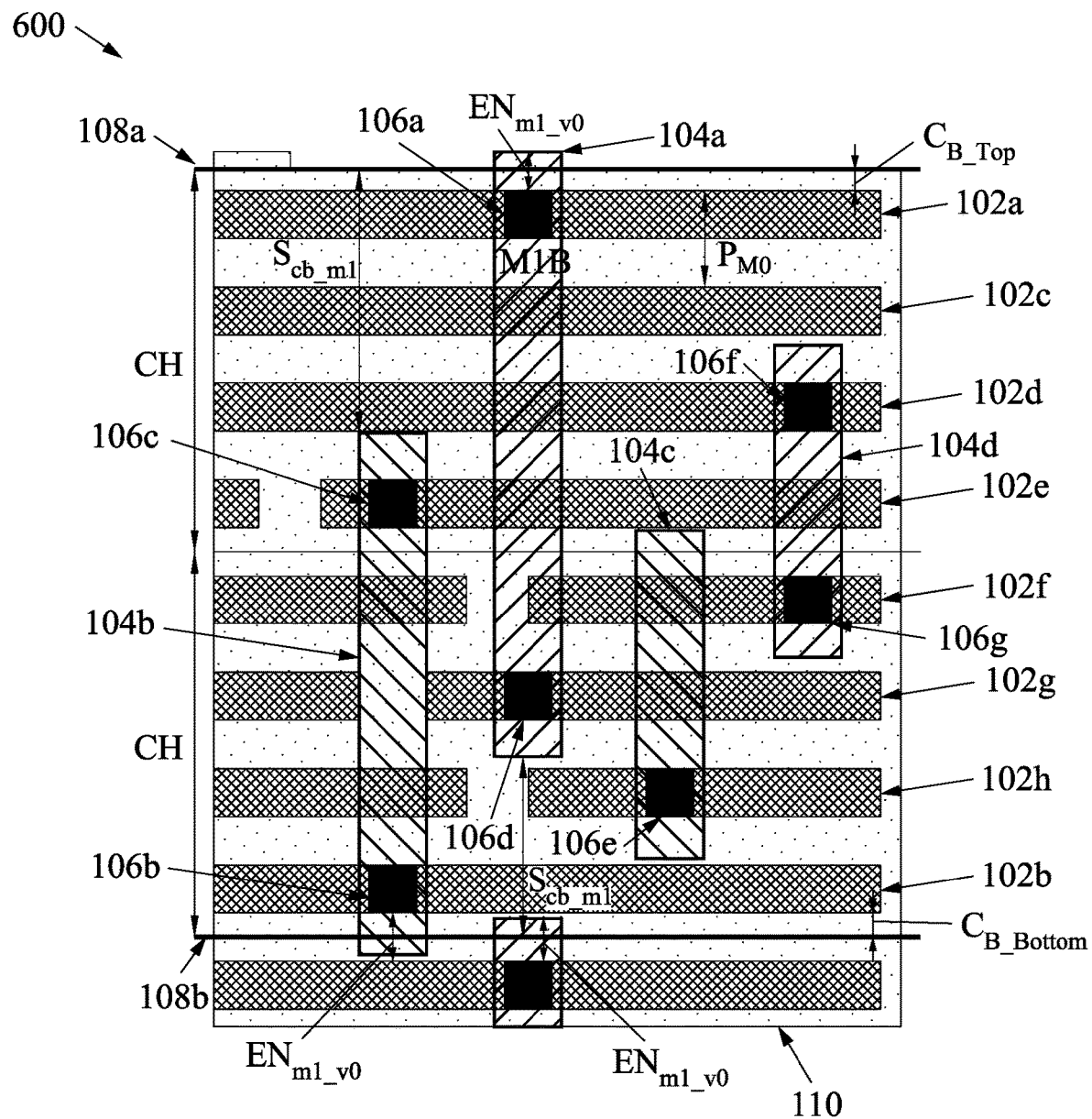
FIG. 6 illustrates a sixth example placement scenario of a circuit in accordance with some embodiments.

FIG. 6 illustrates an example sixth placement scenario 600 for circuit 110 in accordance with some embodiments. In the example sixth placement scenario, circuit 110 includes a double height cell. For example, circuit 110 includes a double height cell which includes a plurality of first metal layer strips, for example, a first first metal layer strip 102a, a second first metal layer strip 102b, a third first metal layer strip 102c, a fourth first metal layer strip 102d, a fifth first metal layer strip 102e, a sixth first metal layer strip 102f, a seventh first metal layer strip 102g, and an eighth first metal layer strip 102h. Each cell height of the double height cell include four first metal layer strips (also referred to as $4M_0$ configuration). In addition, circuit 110 includes a plurality of second metal layer strips, for example, a first second metal layer strip 104a, a second second metal layer strip 104b, a third second metal layer strip 104c, and a fourth second metal layer strip 104d. First first metal layer strip 102a is adjacent to first boundary 108a (that is, the top boundary) and second first metal layer strip is adjacent to second boundary 108b (that is the bottom boundary). First second metal layer strip 104a and third second metal layer strip 104c are of a first color (that is, color A) and second second metal layer strip 104b and fourth second metal layer strip 104d are of a second color (that is, color B).

In example sixth placement scenario 600, the second color second metal layer strips are connected to a first metal layer strip which is adjacent to the bottom boundary and the first color second metal layer strips are connected to a first metal layer strip which is adjacent to the top boundary. For example, and as illustrated in FIG. 6, first second metal layer strip 104a is connected to first first metal layer strip 102a which is adjacent to first boundary 108a through a first via 106a. Moreover, and as shown in FIG. 5, second second metal layer strip 104b is connected to second first metal layer strip 102b which is adjacent to second boundary 108b through a second via 106b. First via 106a may be placed at a predetermined distance (designated as $EN_{m1\_v0}$) from a first end of first second metal layer strip 104a. Similarly, second via 106b may also be placed at the predetermined distance (designated as $EN_{m1\_v0}$) from a second end of second second metal layer strip 104b.

In addition, first second metal layer strip 104a is also connected to seventh first metal layer strip 102g through a third via 106c. Moreover, second second metal layer strip 104b is also connected to fifth first metal layer strip 102e through a fourth via 106d. In addition, third second metal layer strip 104c is connected to eighth first metal layer strip 102h through fifth via 106e. Furthermore, fourth second metal layer strip 104d is connected to sixth first metal layer strip 102f through a sixth via 106f and to fourth first metal layer strip 102d through seventh via 106g.

In example embodiments, in example sixth placement scenario 600, the first color second metal layer strips can extend beyond the top boundary and the second color second metal layer strips can extend beyond the bottom boundary. For example, and as shown in FIG. 6, second second metal layer strip 104b extends beyond second boundary 108b and first second metal layer strip 104a extends beyond first boundary 108a. Although sixth example placement scenarios 600 is shown to include only two colors second metal layer strips (that is, color A and color B), it will be apparent to a person with ordinary skill in the art after reading this disclosure that the second metal layer strips may include more than two colors.

Figure 7:
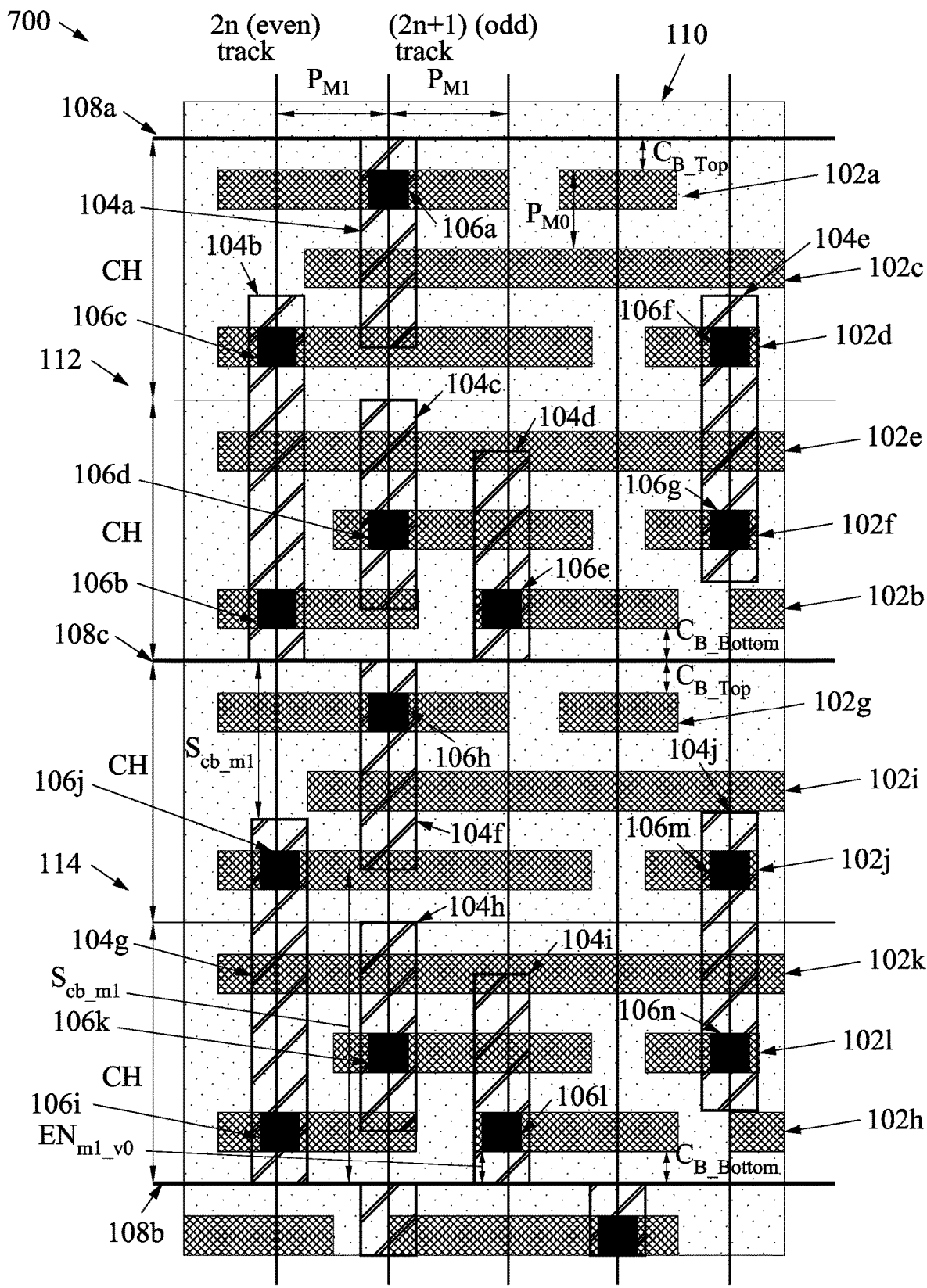
FIG. 7 illustrates a seventh example placement scenario for a circuit in accordance with some embodiments.

FIG. 7 illustrates an example seventh placement scenario 700 in accordance with some embodiments. In example seventh placement scenario 700, circuit 110 includes two a double height cells, for example, a first double height cell 112 and a second double height cell 114. First double height cell 112 is placed adjacent to second double height cell 114. First double height cell 112 includes a plurality of first metal layer strips, for example, a first first metal layer strip 102a, a second first metal layer strip 102b, a third first metal layer strip 102c, a fourth first metal layer strip 102d, a fifth first metal layer strip 102e, and a sixth first metal layer strip 102f. First first metal layer strip 102a is adjacent to first boundary 108a and second first metal layer strip 102b is adjacent to a third boundary 108c. Each cell of circuit 110 includes three first metal layer strips (also referred to as $3M_0$ configuration)

. In addition, first double height cell 112 includes a plurality of second metal layer strips, for example, a first second metal layer strip 104a, a second second metal layer strip 104b, a third second metal layer strip 104c, a fourth second metal layer strip 104d, and a fifth second metal layer strip 104e.

Second double height cell 114 includes a plurality of first metal layer strips, for example, a first first metal layer strip 102g, a second first metal layer strip 102h, a third first metal layer strip 102i, a fourth first metal layer strip 102j, a fifth first metal layer strip 102k, and a sixth first metal layer strip 102l. In addition, second double height cell 114 includes a plurality of second metal layer strips, for example, a first second metal layer strip 104f, a second second metal layer strip 104g, a third second metal layer strip 104h, a fourth second metal layer strip 104i, and a fifth second layer metal stipe 104j. First first metal layer strip 102g is adjacent to third boundary 108c and second first metal layer strip 102h is adjacent to second boundary 108b. Third boundary 108c is the bottom boundary for first double height cell 112 and the top boundary for second double height cell 114.

In example seventh placement scenario 700, the even track second metal layer strips are connected to a first metal layer strip which is adjacent to the bottom boundary and the odd track second metal layer strips are connected to a first metal layer strip which is adjacent to the top boundary. For example, and as illustrated in FIG. 7, first second metal layer strip 104a of first double height cell 112 is connected to first first metal layer strip 102a which is adjacent to first boundary 108a through a first via 106a and first second metal layer strip 104f of first double height cell 112 is connected to first first metal layer strip 102g which is adjacent to third boundary 108c through an eighth via 106h. Moreover, and as shown in FIG. 7, second second metal layer strip 104b of first double height cell 112 is connected to second first metal layer strip 102b which is adjacent to third boundary 108c through a second via 106b and second second metal layer strip 104g of second double height cell 114 is connected to second first metal layer strip 102h which is adjacent to second boundary 108b through a ninth via 106h.

In addition, second second metal layer strip 104b of first double height cell 112 is also connected to fourth first metal layer strip 102d through a fourth via 106c. In addition, third second metal layer strip 104c of first double height cell 112 is connected to sixth first metal layer strip 102f through a fourth via 106d. Furthermore, fourth second metal layer strip 104d of first double height cell 112 is connected to second first metal layer strip 102b through a fifth via 106e. Moreover, fifth second metal layer strip 104e of first double height cell 112 is connected to fourth first metal layer strip 102d through a sixth via 106f and to sixth first metal layer strip 102f through a seventh via 106g. In addition, second second metal layer strip 104g of second double height cell 114 is also connected to fourth first metal layer strip 102j through a tenth via 106j. Moreover, third second metal layer strip 104h of second double height cell 114 is connected to sixth first metal layer strip 102l through a eleventh via 106k. Furthermore, fourth second metal layer strip 104i of second double height cell 114 is connected to second first metal layer strip 102h through a twelfth via 106l. Moreover, fifth second metal layer strip 104j of second double height cell 114 is connected to fourth first metal layer strip 102j through a thirteenth via 106m and to sixth first metal layer strip 102l through a fourteenth via 106n.

Figure 8:
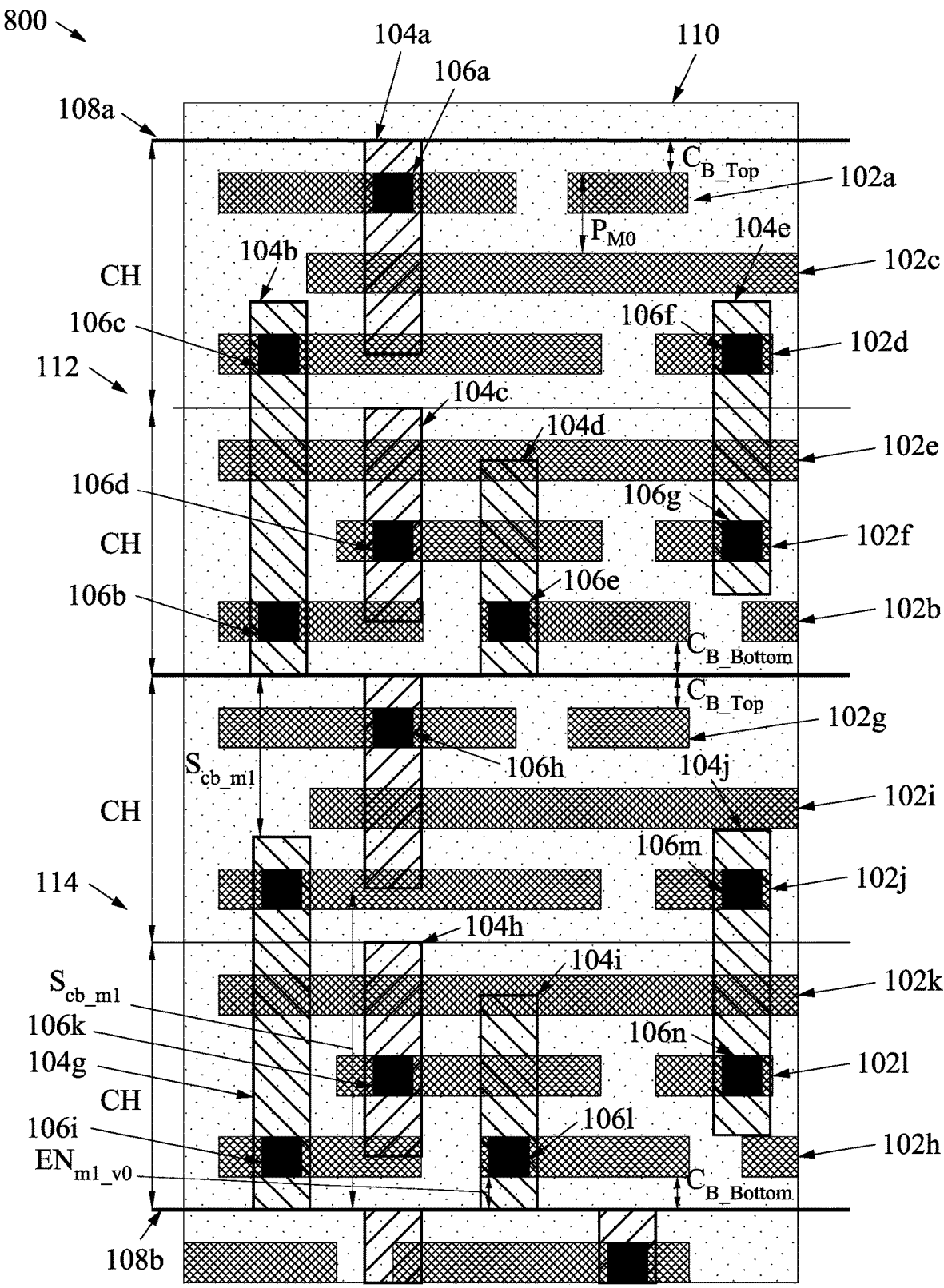
FIG. 8 illustrates an eighth example placement scenario of a circuit in accordance with some embodiments.

FIG. 8 illustrates an example eighth placement scenario 800 in accordance with some embodiments. In example eighth placement scenario 800, circuit 110 includes two a double height cells, for example, a first double height cell 112 and a second double height cell 114 with first double height cell 112 being placed above second double height cell 114. First double height cell 112 includes a plurality of first metal strips, for example, a first first metal strip 102a, a second first metal strip 102b, a third first metal strip 102c, a fourth first metal strip 102d, a fifth first metal strip 102e, and a sixth first metal strip 102f. First first metal strip 102a is adjacent to first boundary 108a and second first metal strip 102b is adjacent to a third boundary 108c.

In addition, first double height cell 112 includes a plurality of second metal layer strips, for example, a first second metal layer strip 104a, a second second metal layer strip 104b, a third second metal layer strip 104c, a fourth second metal layer strip 104d, and a fifth second metal layer stipe 104e. First second metal layer strip 104a and third second metal layer strip 104c are of a first color (that is, color A) and second second metal layer strip 104b, fourth second metal layer strip 104d, and fifth second metal layer strip 104e are of a second color (that is, color B).

Second double height cell 114 includes a plurality of first metal layer strips, for example, a first first metal layer strip 102g, a second first metal layer strip 102h, a third first metal layer strip 102i, a fourth first metal layer strip 102j, a fifth first metal layer strip 102k, and a sixth first metal layer strip 102l. In addition, second double height cell 114 includes a plurality of second metal layer strips, for example, a first second metal layer strip 104f, a second second metal layer strip 104g, a third second metal layer strip 104h, a fourth second metal layer strip 104i, and a fifth second metal layer strip 104j. First first metal layer strip 102g is adjacent to third boundary 108c and second first metal layer strip 102h is adjacent to second boundary 108b. Third boundary 108c is the bottom boundary for first double height cell 112 and the top boundary for second double height cell 114. First second metal layer strip 104f and third second metal layer strip 104h are of a first color (that is, color A) and second second metal layer strip 104b and fourth second metal layer strip 104d are of a second color (that is, color B).

In example eighth placement scenario 800, the second color second metal layer strips are connected to a first metal layer strip which is adjacent to the bottom boundary and the first color second metal layer strips are connected to a first metal layer strip which is adjacent to the top boundary. For example, and as illustrated in FIG. 8, first second metal layer strip 104a of first double height cell 112 is connected to first first metal layer strip 102a which is adjacent to first boundary 108a through a first via 106a. Similarly, and as illustrated in FIG. 8, first second metal layer strip 104f of second double height cell 114 is connected to first first metal layer strip 102g which is adjacent to third boundary 108c through a eighth via 106h. Moreover, and as shown in FIG. 8, second second metal layer strip 104b of first double height cell 112 is connected to second first metal layer strip 102b which is adjacent to third boundary 108c through a second via 106b and second second metal layer strip 104h of second double height cell 114 is connected to second first metal layer strip 102h which is adjacent to second boundary 108b through a ninth via 106i.

In addition, second second metal layer strip 104b of first double height cell 112 is also connected to fourth first metal layer strip 102d through a third via 106c. Moreover, third second metal layer strip 104c of first double height cell 112 is connected to sixth first metal layer strip 102f through a fourth via 106d. Furthermore, fourth second metal layer strip 104d of first double height cell 112 is connected to second first metal layer strip 102b through a fifth via 106e. More-over, fifth second metal layer strip 104e of first double height cell 112 is connected to fourth first metal layer strip 102d through a sixth via 106f and to sixth first metal layer strip 102f through a seventh via 106g. In addition, second second metal layer strip 104g of second double height cell 114 is also connected to fourth first metal layer strip 102j through a tenth via 106j. Moreover, third second metal layer strip 104h of second double height cell 114 is connected to sixth first metal layer strip 102l through a eleventh via 106k. Furthermore, fourth second metal layer strip 104i of second double height cell 114 is connected to second first metal layer strip 102h through a twelfth via 106l. Moreover, fifth second metal layer strip 104j of second double height cell 114 is connected to fourth first metal layer strip 102j through a thirteenth via 106m and to sixth first metal layer strip 102l through a fourteenth via 106n. Although eighth example placement scenario 800 is shown to include only two colors second metal layer strips (that is, color A and color B), it will be apparent to a person with ordinary skill in the art after reading this disclosure that the second metal layer strips may include more than two colors.

Figure 9:
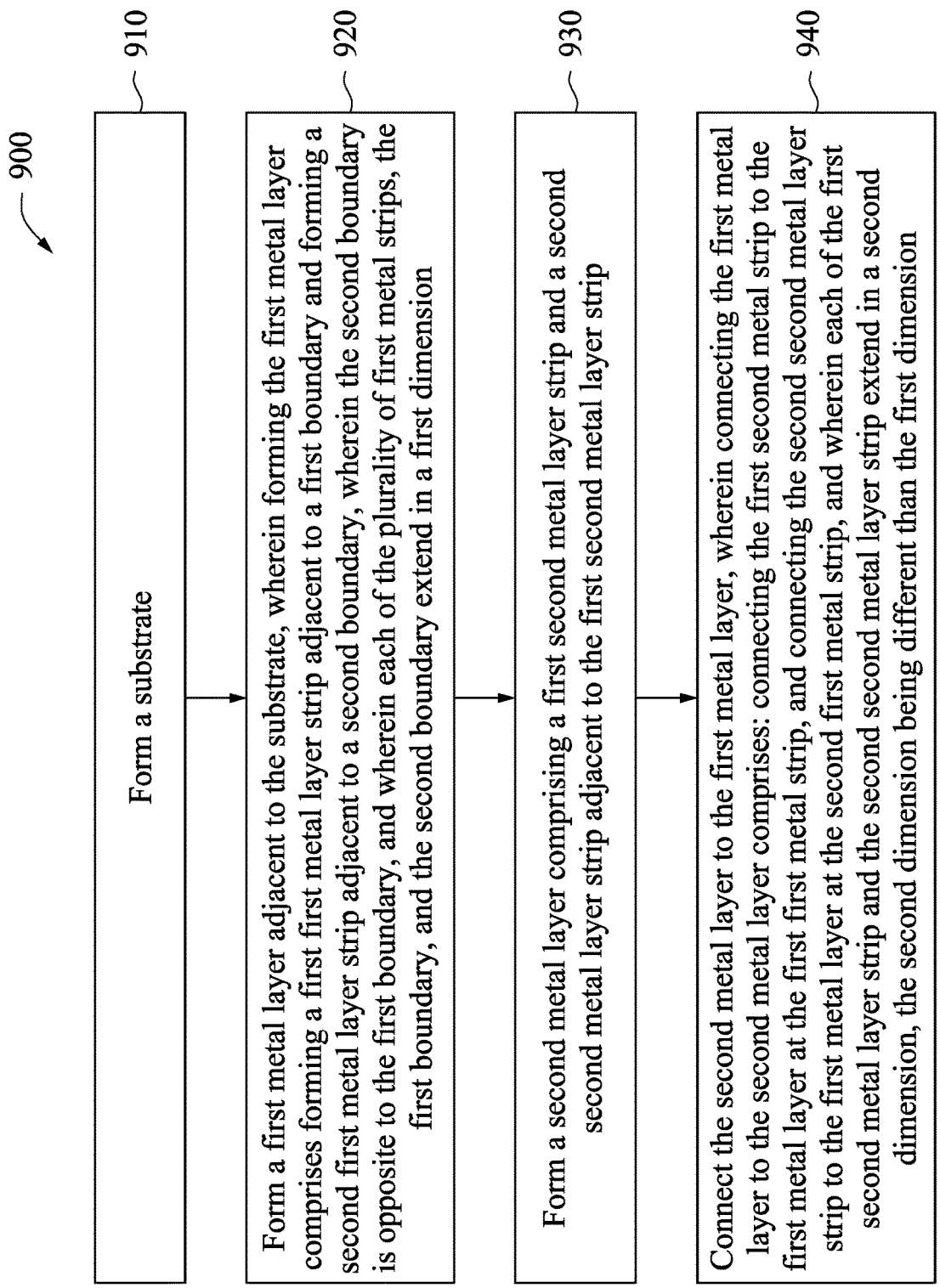
FIG. 9 is a flow diagram illustrating a method for forming a circuit in accordance with some embodiments.

FIG. 9 is a flow diagram of a method 900 for forming a circuit in accordance with some embodiments. Steps of method 900 may be stored as instructions which may be executed by a processor of an operating environment to implement method 900. An example operating environment is described in detail with reference to FIG. 10 of the specification. At block 910 of method 900, a substrate is formed. At block 920 of method 900, a first metal layer is formed adjacent to the substrate. Forming the first metal layer includes forming a first first metal layer strip adjacent to a first boundary and forming a second first metal layer strip adjacent to a second boundary. The second boundary is opposite to the first boundary. Each of the plurality of first metal strips, the first boundary, and the second boundary extend in a first dimension.

At block 930 of method 900, a second metal layer having a first second metal layer strip and a second second metal layer strip is formed adjacent to the first second metal layer strip. At block 940 of method 900, the second metal layer is connected to the first metal layer. Connecting the first metal layer to the second metal layer includes: connecting the first second metal strip to the first metal layer at the first first metal strip, and connecting the second second metal layer strip to the first metal layer at the second first metal strip. Each of the first second metal layer strip and the second second metal layer strip extend in a second dimension, the second dimension being different than the first dimension.

In example embodiments, the example placement scenarios described herein with reference to FIGS. 1-8 may provide layout guidelines for cell abutment without placement constraint. For example, the layout guidelines disclosed herein may avoid shortening of the plurality of second metal layer strips between abutting cells without requiring any placement constraint for the abutment.

Figure 10:
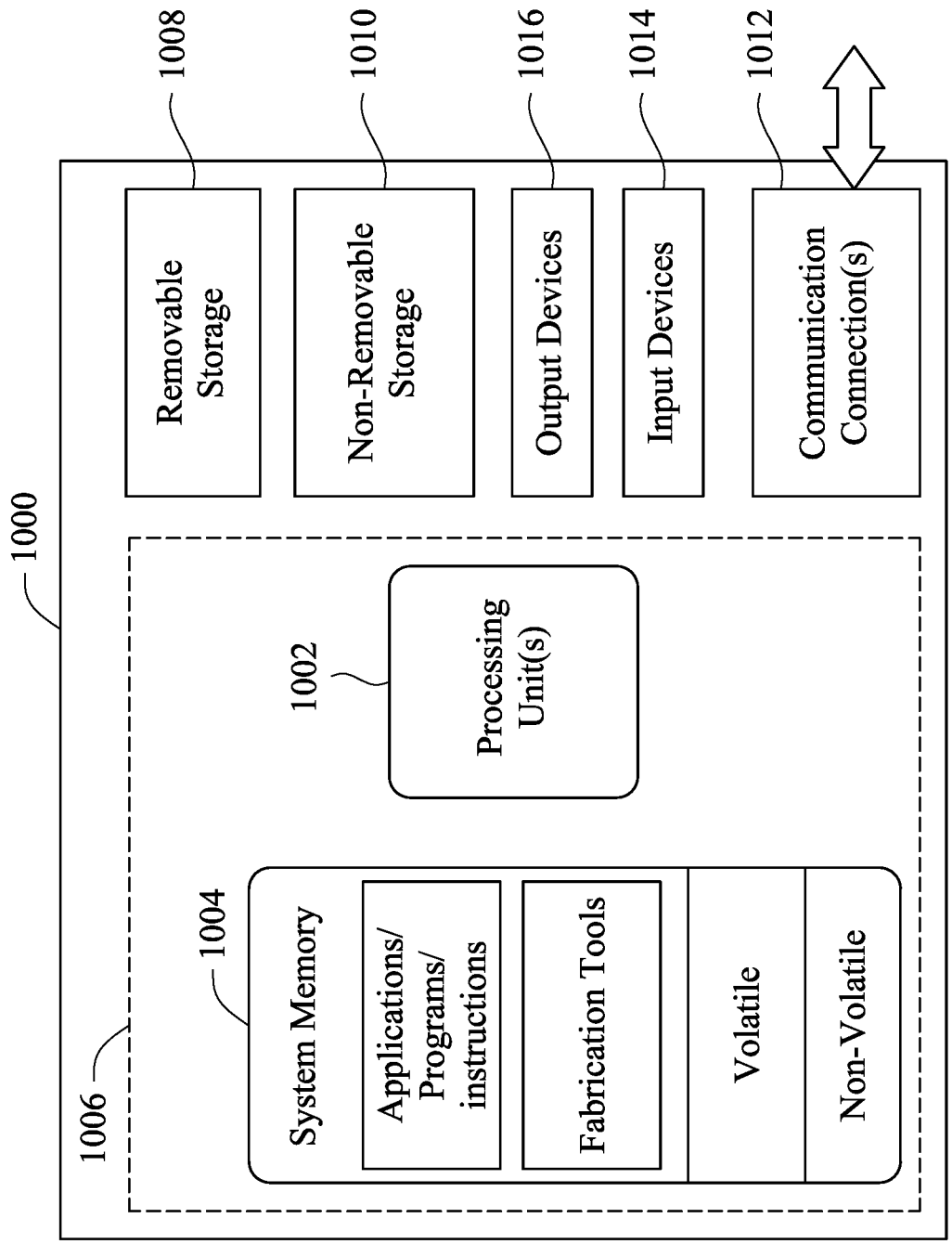
FIG. 10 illustrates an example of a suitable operating environment in which one or more of the present examples may be implemented.

FIG. 10 and the additional discussion in the present specification are intended to provide a brief general description of a suitable computing environment in which the present disclosure and/or portions thereof may be implemented. Although not required, the embodiments described herein may be implemented as computer-executable instructions, such as by program modules, being executed by a computer, such as a client workstation or a server. Generally, program modules include routines, programs, objects, components, data structures and the like that perform particular tasks or implement particular abstract data types. Moreover, it should be appreciated that the invention and/or portions thereof may be practiced with other computer system configurations, including hand-held devices, multi-processor systems, microprocessor-based or programmable consumer electronics, network PCs, minicomputers, mainframe computers and the like. The invention may also be practiced in distributed computing environments where tasks are performed by remote processing devices that are linked through a communications network. In a distributed computing environment, program modules may be located in both local and remote memory storage devices.

FIG. 10 illustrates one example of a suitable operating environment 1000 in which one or more of the present embodiments may be implemented. This is only one example of a suitable operating environment and is not intended to suggest any limitation as to the scope of use or functionality. Other well-known computing systems, environments, and/or configurations that may be suitable for use include, but are not limited to, personal computers, server computers, hand-held or laptop devices, multiprocessor systems, microprocessor-based systems, programmable consumer electronics such as smart phones, network PCs, minicomputers, mainframe computers, distributed computing environments that include any of the above systems or devices, and the like.

In its most basic configuration, operating environment 1000 typically may include at least one processing unit 1002 and memory 1004. Depending on the exact configuration and type of computing device, memory 1004 (storing, among other things, APIs, programs, etc. and/or other components or instructions to implement or perform the system and methods disclosed herein, etc.) may be volatile (such as RAM), non-volatile (such as ROM, flash memory, etc.), or some combination of the two. This most basic configuration is illustrated in FIG. 10 by dashed line 1006. Further, environment 1000 may also include storage devices (removable, 1008, and/or non-removable, 1010) including, but not limited to, magnetic or optical disks or tape. Similarly, environment 1000 may also have input device(s) 1014 such as a keyboard, mouse, pen, voice input, etc. and/or output device(s) 1016 such as a display, speakers, printer, etc. Also included in the environment may be one or more communication connections, 1012, such as LAN, WAN, point to point, etc.

Operating environment 1000 may include at least some form of computer readable media. The computer readable media may be any available media that can be accessed by processing unit 1002 or other devices comprising the operating environment. For example, the computer readable media may include computer storage media and communication media. The computer storage media may include volatile and nonvolatile, removable and non-removable media implemented in any method or technology for storage of information such as computer readable instructions, data structures, program modules or other data. The computer storage media may include RAM, ROM, EEPROM, flash memory or other memory technology, CD-ROM, digital versatile disks (DVD) or other optical storage, magnetic cassettes, magnetic tape, magnetic disk storage or other magnetic storage devices, or any other non-transitory medium which can be used to store the desired information. The computer storage media may not include communication media.

The communication media may embody computer readable instructions, data structures, program modules, or other data in a modulated data signal such as a carrier wave or other transport mechanism and includes any information delivery media. The term "modulated data signal" may mean a signal that has one or more of its characteristics set or changed in such a manner as to encode information in the signal. For example, the communication media may include a wired media such as a wired network or direct-wired connection, and wireless media such as acoustic, RF, infrared and other wireless media. Combinations of any of the above should also be included within the scope of computer readable media.

Operating environment 1000 may be a single computer operating in a networked environment using logical connections to one or more remote computers. The remote computer may be a personal computer, a server, a router, a network PC, a peer device or other common network node, and typically includes many or all of the elements described above as well as others not so mentioned. The logical connections may include any method supported by available communications media. Such networking environments are commonplace in offices, enterprise-wide computer networks, intranets and the Internet.

The different aspects described herein may be employed using software, hardware, or a combination of software and hardware to implement and perform the systems and methods disclosed herein. Although specific devices have been recited throughout the disclosure as performing specific functions, one skilled in the art will appreciate that these devices are provided for illustrative purposes, and other devices may be employed to perform the functionality disclosed herein without departing from the scope of the disclosure.

As stated above, a number of program modules and data files may be stored in system memory 1004. While executing on processing unit 1002, program modules 1008 (e.g., applications, Input/Output (I/O) management, fabrication tools, and other utilities) may perform processes including, but not limited to, one or more of the stages of the operational methods described herein such as method 900 illustrated in FIG. 9. For example, system memory 1004 may include a software code and fabrication tools which may be executed by processing unit 1002 to obtain integrated system design and/or layout for performing method as described with respect to FIG. 9. For instance, such code and fabrication tools may include an example integrated circuit design and fabrication process implemented by the operating environment 1000. In addition to the example steps shown in FIG. 9 various process steps may be performed such as cell placement and routing to complete a device layout. A photolithographic mask may be generated based on the layout, and an integrated circuit is fabricated based on the photo mask.

Furthermore, examples of the invention may be practiced in an electrical circuit comprising discrete electronic elements, packaged or integrated electronic chips containing logic gates, a circuit utilizing a microprocessor, or on a single chip containing electronic elements or microprocessors. For example, examples of the invention may be practiced via a system-on-a-chip (SOC) where each or many of the components illustrated in FIG. 10 may be integrated onto a single integrated circuit. Such an SOC device may include one or more processing units, graphics units, communications units, system virtualization units and various application functionality all of which are integrated (or "burned") onto the chip substrate as a single integrated circuit. When operating via an SOC, the functionality described herein may be operated via application-specific logic integrated with other components of the operating environment 1000 on the single integrated circuit (chip). Examples of the present disclosure may also be practiced using other technologies capable of performing logical operations such as, for example, AND, OR, and NOT, including but not limited to mechanical, optical, fluidic, and quantum technologies. In addition, examples of the invention may be practiced within a general purpose computer or in any other circuits or systems.

In accordance with example embodiments, a circuit comprises: a first metal layer comprising a plurality of first metal layer strips, wherein the plurality of first metal layer strips comprises a first first metal layer strip adjacent to a first boundary and a second first metal layer strip adjacent to a second boundary, wherein the second boundary is opposite to the first boundary, and wherein each of the plurality of first metal layer strips, the first boundary, and the second boundary are substantially parallel to each other; and a second metal layer comprising a first second metal layer strip and a second second metal layer strip adjacent to the first second metal layer strip, wherein the first second metal layer strip is connected to the first metal layer at the first first metal layer strip, wherein the second second metal layer strip is connected to the first metal layer at the second first metal layer strip, and wherein each of the first second metal layer strip and the second second metal layer strip are substantially parallel to each other.

In example embodiments, a device comprises: a first metal layer comprising a plurality of first metal layer strips comprising a first first metal layer strip adjacent to a first boundary and a second first metal layer strip adjacent to a second boundary of the circuit, wherein the second boundary is opposite to the first boundary, and wherein each of the plurality of first metal layer strips, the first boundary, and the second boundary are substantially parallel to each other in a first dimension; and a plurality of second second metal layer strips designated as one of an odd track second metal layer strip and an even track second metal layer strip in alternate, wherein each odd track second metal layer strip is connected to the first metal layer at the first first metal layer strip, wherein each even track second metal layer strip is connected to the first metal layer at the second first metal layer strip, and wherein each even track second metal layer strip are substantially parallel to each other in a second dimension, the second dimension being different than the first dimension.

In accordance with example embodiments, a method of forming a circuit comprises: forming a substrate; forming a first metal layer adjacent to the substrate, wherein forming the first metal layer comprises forming a first first metal layer strip adjacent to a first boundary and forming a second first metal layer strip adjacent to a second boundary, wherein the second boundary is opposite to the first boundary, and wherein each of the plurality of first metal strips, the first boundary, and the second boundary extend in a first dimension; forming a second metal layer comprising a first second metal layer strip and a second second metal layer strip adjacent to the first second metal layer strip; and connecting the second metal layer to the first metal layer, wherein connecting the first metal layer to the second metal layer comprises: connecting the first second metal strip to the first metal layer at the first first metal strip, and connecting the second second metal layer strip to the first metal layer at the second first metal strip, and wherein each of the first second metal layer strip and the second second metal layer strip extend in a second dimension, the second dimension being different than the first dimension.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit comprising:
a first metal layer comprising a plurality of first metal layer strips, wherein the plurality of first metal layer strips comprises a first first metal layer strip adjacent to a first boundary of a cell and a second first metal layer strip adjacent to a second boundary of the cell such that the first first metal layer strip is closer to the first boundary than it is to the second boundary and the second first metal layer strip is closer to the second boundary than it is to the first boundary, wherein the second boundary is opposite to the first boundary, and wherein each of the plurality of first metal layer strips, the first boundary, and the second boundary are substantially parallel to each other; and
a second metal layer comprising a first second metal layer strip and a second second metal layer strip, wherein the first second metal layer strip and the second second metal layer strip are substantially parallel to each other and perpendicular to each of the plurality of first metal layer strips, the first boundary, and the second boundary,
wherein the first second metal layer strip is connected to the first metal layer at the first first metal layer strip through a first via, wherein the first via is located at a first predetermined distance from a first end of the first second metal strip that extends at least to the first boundary, wherein a second end of the first second metal layer strip is spaced apart by a second predetermined distance from the second boundary,
wherein the second second metal layer strip is connected to the first metal layer at the second first metal layer strip through a second via, wherein the second via is located at the first predetermined distance from a second end of the second second metal layer strip, wherein the second end of the second second metal layer strip extends at least to the second boundary,
wherein a first end of the second second metal layer strip is spaced apart by the second predetermined distance from the first boundary, and wherein both the first end of the first second metal layer strip and the first end of the second second metal layer strip are closer to the first boundary than the second boundary,
such that the cell is configured to abut an adjacent cell without a placement constraint.

2. The device of claim 1, wherein the first second metal layer strip is an odd numbered second metal layer strip, and wherein the second second metal layer strip is an even numbered second metal layer strip.

3. The device of claim 2, wherein the odd numbered second metal layer strip extends beyond the first boundary and the even numbered second metal layer strip extends beyond the second boundary.

4. The device of claim 1, wherein the first second metal layer strip is an even numbered second metal layer strip, and wherein the second second metal layer strip is an odd numbered second metal layer strip.

5. The device of claim 4, wherein the even numbered second metal layer strip extends beyond the first boundary and the odd numbered second metal layer strip extends beyond the second boundary.

6. The device of claim 1, wherein the first second metal layer strip is a first color second metal layer strip, and wherein the second second metal layer strip is a second color second metal layer strip.

7. The device of claim 6, wherein the first color second metal layer strip extends beyond the first boundary and the second color second metal layer strip extends beyond the second boundary.

8. A device comprising:
   a first metal layer comprising a plurality of first metal layer strips comprising a first first metal layer strip adjacent to a first boundary of a cell and a second first metal layer strip adjacent to a second boundary of the cell such that the first first metal layer strip is closer to the first boundary than it is to the second boundary and the second first metal layer strip is closer to the second boundary than it is to the first boundary, wherein the second boundary is opposite to the first boundary, and wherein each of the plurality of first metal layer strips, the first boundary, and the second boundary are substantially parallel to each other in a first dimension; and
   a second layer comprising a plurality of second metal layer strips, wherein each of the plurality of second metal layer strips are designated as one of an odd track second metal layer strip and an even track second metal layer strip in alternate, wherein a first odd track second metal layer strip is connected to the first metal layer at the first first metal layer strip through a first via, wherein the first via is located at a first predetermined distance from a first end of the first odd track second metal layer strip that extends at least to the first boundary, wherein a second end of the first odd track second metal layer strip is spaced apart by a second predetermined distance from the second boundary,
   wherein a first even track second metal layer strip is connected to the first metal layer at the second first metal layer strip through a second via, wherein the second via is located at the first predetermined distance from a second end of the first even track second metal strip, wherein the second end of the first even track second metal layer strip extends at least to the second boundary,
   wherein a first end of the first even track second metal layer strip is spaced apart by the second predetermined distance from the first boundary, wherein both the first end of the first odd track second metal layer strip and the first end of the first even track second metal layer strip are closer to the first boundary than the second boundary, and wherein each of the plurality of second metal layer strips are substantially parallel to each other in a second dimension, the second dimension being different than the first dimension, such that the cell is configured to abut an adjacent cell without a placement constraint.

9. The device of claim 8, wherein the first odd track second metal layer strip extends from the first boundary in the second dimension up to a third predetermined distance from the second boundary.

10. The device of claim 8, wherein the first even track second metal layer strip extends from the second boundary in the second dimension up to a third predetermined distance from the first boundary.

11. The device of claim 8, wherein the first odd track second metal layer strip extends at least $0.3P_{M0}$ from the first via, and wherein $P_{M0}$ is a pitch of the plurality of first metal layer strips.

12. The device of claim 8, wherein the first first metal layer strip is at a distance in a range of $0.2P_{M0}$-$0.5P_{M0}$ from the first boundary, and wherein $P_{M0}$ is a pitch of the plurality of first metal layer strips.

13. The device of claim 8, wherein the second first metal layer strip is at a distance in a range of $0.2P_{M0}$-$0.5P_{M0}$ from the second boundary, and wherein $P_{M0}$ is a pitch of the plurality of first metal layer strips.

14. The device of claim 8, wherein the first odd track second metal layer strip extends beyond the first boundary and the first even track second metal layer strip extends beyond the second boundary.

15. The device of claim 8, wherein even track second metal layer strips are of a first color and odd numbered second layer strips are of a second color, the second color being different than the first color.

16. The device of claim 15, wherein the first color comprises a first pattern and the second color comprises a second pattern.

17. A method of forming a circuit, the method comprising:
   forming a cell, comprising:
   forming a substrate;
   forming a first metal layer adjacent to the substrate, wherein forming the first metal layer comprises forming a first first metal layer strip adjacent to a first boundary and forming a second first metal layer strip adjacent to a second boundary such that the first first metal layer strip is closer to the first boundary than it is to the second boundary and the second first metal layer strip is closer to the second boundary than it is to the first boundary, wherein the second boundary is opposite to the first boundary, and wherein each of a plurality of first metal layer strips comprising the first first metal layer strip and the second first metal layer strip, the first boundary, and the second boundary extend in a first dimension;
   forming a second metal layer comprising a first second metal layer strip and a second second metal layer strip adjacent to the first second metal layer strip; and
   connecting the second metal layer to the first metal layer, wherein connecting the first metal layer to the second metal layer comprises:
   connecting the first second metal layer strip to the first metal layer at the first first metal layer strip through a first via, wherein the first via is located at a first predetermined distance from a first end of the first second metal layer strip that extends at least to the first boundary, and wherein a second end of the first second metal layer strip is spaced apart by a second predetermined distance away from the second boundary, and
   connecting the second second metal layer strip to the first metal layer at the second first metal layer strip through a second via, wherein the second via is located at the first predetermined distance from a second end of the second second metal layer strip that extends at least to the second boundary, wherein a first end of the second second metal layer strip is spaced apart by the second predetermined distance away from the first boundary, wherein both the first end of the first second metal layer strip and the first end of the second second metal layer strip are closer to the first boundary than the second boundary, and wherein each of the first second metal layer strip and the second second metal layer strip extend in a second dimension, the second dimension being different than the first dimension; and placing the cell in an abutting relationship with an adjacent cell without a placement constraint.

18. The method of claim 17, wherein the first second metal layer strip extends beyond the first boundary and the second second metal layer strip extends beyond the second boundary.

19. The method of claim 17, wherein the second first metal layer strip is at a distance in a range of $0.2P_{M0}$-$0.5P_{M0}$ from the second boundary, and wherein $P_{M0}$ is a pitch of the plurality of first metal layer strips.

20. The method of claim 17, wherein the first first metal layer strip is at a distance in a range of $0.2P_{M0}$-$0.5P_{M0}$ from the first boundary, and wherein $P_{M0}$ is a pitch of the plurality of first metal layer strips.

* * * * *